United States Patent [19]

Eich et al.

[11] Patent Number: 4,896,292

[45] Date of Patent: Jan. 23, 1990

[54] APPARATUS FOR THE REVERSIBLE, OPTICAL STORAGE OF DATA

[75] Inventors: Manfred Eich, Frankfurt; Joachim Wendorff, Nauheim, both of Fed. Rep. of Germany

[73] Assignee: Rohm GMBH Chemische Fabrik, Darmstadt, Fed. Rep. of Germany

[21] Appl. No.: 262,031

[22] Filed: Oct. 26, 1988

Related U.S. Application Data

[63] Continuation of Ser. No. 10,488, Feb. 3, 1987, abandoned.

[30] Foreign Application Priority Data

Feb. 4, 1986 [DE] Fed. Rep. of Germany ....... 3603267

[51] Int. Cl.$^4$ ...................... G11C 13/02; G11C 13/04
[52] U.S. Cl. .................................... 365/108; 365/106; 365/107; 350/352
[58] Field of Search ............... 365/106, 107, 108, 120; 350/330, 352

[56] References Cited

U.S. PATENT DOCUMENTS

| | | | |
|---|---|---|---|
| 2,978,437 | 4/1961 | Christenson | 260/72 |
| 4,293,435 | 10/1981 | Portugall et al. | |
| 4,325,739 | 4/1982 | Biermann et al. | |
| 4,702,558 | 10/1987 | Coles et al. | |
| 4,702,945 | 10/1987 | Etzbach et al. | |

FOREIGN PATENT DOCUMENTS

| | | |
|---|---|---|
| 0044893 | 2/1982 | European Pat. Off. |
| 2079304 | 1/1982 | United Kingdom |
| 2094822 | 9/1982 | United Kingdom |
| 2146787 | 4/1985 | United Kingdom |

Primary Examiner—Terrell W. Fears
Attorney, Agent, or Firm—Oblon, Spivak, McClelland, Maier & Neustadt

[57] ABSTRACT

The invention relates to an apparatus for reversible optical data storage using polymeric liquid crystals with mesogenic side groups as a storage medium, arranged to store information by means of selective variation of the order of the polymeric liquid crystals be means of a heat source. The macroscopically oriented film made from the liquid crystal polymer is held in the solid form retaining condition of the liquid crystal polymer in the temperature range below the glass temperature $T_g > T_a$ (room temperature) for the purpose of storing the information. The polymer is then selectively and locally heated by means of the heat source into the isotropic liquid condition and the local information is fixed in the glass condition of the polymer after the heat source is turned off.

32 Claims, 1 Drawing Sheet

APPARATUS FOR THE REVERSIBLE, OPTICAL STORAGE OF DATA

This application is a continuation of application Ser. No. 010,488, filed on Feb. 3, 1987, now abandoned.

BACKGROUND OF THE INVENTION

1. Field of the Invention

The invention relates to an apparatus for the reversible, optical storage of data using polymeric liquid crystals.

2. Discussion of the Background

Thermotropic liquid crystals are generally regarded as strongly anisotropic liquid phases which exist between the solid phase and the isotropic, liquid phase. The anisotropy of the phase is a result of the extensive macroscopic orientation of the molecular components. The geometric shape of the molecular components of substances having liquid crystal phases is already strongly anisotropic. The molecules have, for example, a ratio of length to thickness of more than three and can in part by regarded as small rigid bars. Generally, this structural anistropy results in an uniaxial molecular orientation within given areas. While a three-dimensional arrangement holds for solid crystals, the molecular units in liquid crystals are arranged in two or one dimension. Structural differences allow a classification of the liquid crystal phases into (a) smectic, (b) nematic, (c) cholesteric phases and (d) discotic phases. (See Ullmanns Encyklopaedie der Techn. Chemie, 4th ed., vol. 11, Kirk-Othmer, Encyclopedia of Chemical Technology, 3rd. ed. Vol. 14, 395–427 (1981)).

Smectic phases demonstrate a two-dimensional layered structure, whereby the layers can be slightly displaced relative to each other. Nematic phases are distinguished by a parallel orientation of the longitudinal axes of the molecules, whereby the lateral bonding between the moelcules is small, so that the molecules can freely slide past one another. A parallel orientation of the molecules in nematic phases over large distances (e.g., in display segments) requires additional energy expenditure in the form, for example, of magnetic or electrical fields. In the cholesteric mesophase the longitudinal axes of the molecules are arranged parallel to each other, as in the nematic phase, so that layers are present having a single preferred direction of the molecules parallel to the layer plane. The direction of the longitudinal axes of the molecules, however, changes from layer to layer in a helical manner. In order to characterize the thermodynamic stability of liquid crystal phases, reference is often made to the clarification temperature, i.e., the temperature at which the anisotropic phase is converted into the isotropic liquid phase. Liquid crystals often demonstrate polymorphy, i.e., they can assume more than one type of mesomorphic structure, for example, in dependence on temperature, composition and/or employed solvent such as in lyotropic systems. Technology has made use of low molecular weight liquid crystals for a number of applications. The application of electro-optic effects has won particular significance in the area of displays (wristwatches, pocket calculators, digital measuring devices, large displays). Most liquid crystals are very sensitive to outside influences, so that they generally must be protected from the environment, i.e., must be sealed.

In recent years it has become recognized that even certain types of polymers possess the characteristics of liquid crystals and can demonstrate thermotropic mesomorphy. Accordingly, (i) the mesogenic units can be components of the primary polymer chain, or (ii) the mesogenic groups can belong to the polymer structure as side groups, by means of flexible spacer units.

Liquid crystal polymers combine characteristics of liquid crystals and polymers. The demobilization of the liquid crystal groups achieves most of the stabilization of the mesophases (higher clearing temperatures); on the other hand, in the glass condition, suitable polymers can be frozen into anisotropic phases.

Like low-molecular weight systems, liquid crystal polymers form temperature-dependent nematic, cholesteric, smectic mesophases or discotic phases. In contrast to low-molecular weight liquid crystals, which convert from the liquid crystal to the crystalline condition as they cool, some liquid-crystal polymers demonstrate a transition from the mesophase into the glass condition. In the transition into the crystal condition the liquid crystal arrangement is removed, whereby, in contrast, in the glass condition, the liquid crystal arrangement is essentially retained (anisotropic glasses). The glass condition is commonly determined by the glass temperature ($T_g$). See Brandrup-Immergut; Polymer-Handbook, Vieweg-Esser, Kunststoff-Handbuch, Vol. IX, pp. 330–340, C. Hanser-Verlag (1975).

Thus far, primarily polymers with liquid crystal groups in the primary chain have been used in technical applications. Here, the parallel arrangement of these groups leads to fibers strongly oriented in the longitudinal direction, such as aromatic polyamide fibers, with extremely high strength and high thermal stability. See Kirk-Othmer, Encyclopedia of Chemical Technology, 3rd Ed., Vol. 14, pp. 414–421 (1981). Recently, polymers with mesogenic side groups have received a great deal of notice. See S. B. Clough, A. Blumstein & E. C. Hsu, Macromolecules, 9, 123 (1976); V. N. Tsekov et al., Europ. Polymer I. 9, 481 (1973); L. Strzelecky & L. Libert, Bull. Soc. Chim. France, 297 (1973); H. Finkelmann in "Polymer Liquid Crystals", Academic Press, 1982; J. Frenzel, G. Rehage, Macromol. Chem., 184, 1689–1703 (1983); Makromol, Chem. Rapid Commun., 1, 129 (1980); D. Hoppner, J. H. Wendorff, Die Angewandte Makromolekulare Chemie, 125, 37–51 (1984).

U.S. Pat. No. 4,293,435 discloses a technical application of the specific behavior of the liquid crystal polymers which is connected with the transition into the glass condition. Information is stored through the application of conditions which in a definite manner alter the arrangement and orientation of the liquid crystal polymers (e.g., electrical and magnetic fields or pressure). This prior art is discussed in GB 2,146,787. Reference is made to the fact that in U.S. Pat. No. 4,293,435 the storage of the apparatus in the solid condition beneath the glass temperature ($T_g$) means that $T_g$ lies above the common room temperature ($T_a$), i.e., that the polymer system is employed at temperatures lying on the order of 100° C. above $T_a$, if the information is to be stored within reasonable periods of time. Such temperatures are awkward, and over longer periods of time, they result in a decomposition of the polymers. These difficulties are avoided in GB 2,146,787 through the use of certain polymeric side chain liquid crystals. It is then no longer necessary to maintain a temperature range below the $T_g$, but rather a storage that is stable for years is said to be possible at temperatures above $T_g$ and below a temperature ($T_f$), at which the polymer material begins to become liquid.

The determination of the $T_f$ can be accomplished by observing light passage through a liquid crystal polymer between two crossed polarization filters with an increasing temperature beginning at the glass temperature. At a point several degrees below the smectic-isotropic phase transition the light permeability suddenly increases. This increase is caused by the transition from an anisotropic condition of the region which has low light permeability to a high grade, double refractive light permeable condition of this region. The temperature range above this temperature $T_f$ is designated as the "fluid region". As the temperature increases, so does the light permeability, until it reaches its maximum at a $T_m$. $T_m$ denotes the point at which the isotropic (clear) phase first appears. Because the appearance of the isotropic phase leads to an extinction of the light with crossed polarizers, a further temperature increase results in a reduction of the light passage to the same degree that the size of the isotropic region grows, until the socalled clearing temperature ($T_c$) is reached, at which the final remnants of the structure responsible for the double refraction have disappeared.

In GB 2,147,787 an apparatus is claimed having a material layer which contains a liquid crystal polymer with mesogenic side chains, as well as devices for the thermal transfer of at least a portion of the material out of the viscous condition, in which the material is at a temperature in the range between $T_g$ and $T_f$, into the fluid region and devices to affect at least a portion of the material in the fluid region. These devices are used to cause a selective alteration in the texture of the molecules in the material and thereby input information which is retained even after cooling of the fluid region and return into the viscous condition. According to GB 2,147,787 it is therefore an essential prerequisite to use a polymer material for which the following is true: $T_f > T_a > T_g$. In addition, an apparatus is described in which the material layer contains a liquid crystal polymer with a smectogenic side chain. Especially preferred are polymeric liquid crystals of the polysiloxane type with diphenylcyanogen side chains or benzoic acid ester side chains.

There is still great interest in optical storage media, which in addition to high recording density also present the possibility of reversible storage. The above-described solutions to this problem of optical data storage represent relatively narrow, limited technical solutions. Thus, the apparatus according to the GB 2,147,787 is based on the use of liquid crystal side chain polymers with the essential requirement that the temperature be selected such that the polymer material is held within the range of its viscous condition. The disclosure specifically mentions polysiloxane liquid crystals, preferably having diphenylcyanogen or benzoic acid ester side chains. The stability of the stored information is not clearly guaranteed, due to the mobility of the molecules and the limited relaxation periods, as well as the possibility of outside influence on the system, e.g., by means of interfering fields.

SUMMARY OF THE INVENTION

Accordingly, one object of the present invention is to provide an apparatus for reversible optical data storage which avoids high temperatures and the associated decomposition of the polymers.

Another object of the invention is to provide an apparatus for reversible optical data storage which utilizes liquid crystal polymers for which the glass temperature ($T_g$) is greater than room temperature ($T_a$).

A further object of the invention is to provide an apparatus for the reversible optical data storage which is versatile and can be used for optical signal processing, Fourier transform and folding, the production of image-receiving systems, the production and storage of holograms, and coherent optical correlation technology.

Another object of the invention is to provide a method for the reversible optical storage of information which allows high density recording.

These objects and other objects of the present invention which will become apparent from the following specification have been achieved by the novel apparatus for reversible optical data storage of the present invention, which comprises a macroscopically oriented film of a liquid crystal polymer, wherein the film is held in the temperature range below the glass temperature, and wherein the glass temperature is greater than room temperature; and the method for the reversible optical storage of information of the present invention which comprises the steps of (i) holding a macroscopically oriented film of a liquid crystal polymer in the temperature range below the glass temperature, and wherein the glass temperature is greater than room temperature;

(ii) storing information by irradiating the film with a coherent, monochromatic light source, wherein selective variation of the spacial arrangement or orientation of the liquid crystalline polymer occurs and is frozen in the temperature range below the glass temperature after the irradiating is stopped; and (iii) reading the stored information by irradiating the film with a coherent, monochromatic light source.

BRIEF DESCRIPTION OF THE DRAWING

A more complete appreciation of the invention and many of the attendant advantages thereof will be readily obtained as the same becomes better understood by reference to the following detailed description when considered in connection with the accompanying drawing, wherein.

DETAILED DESCRIPTION OF THE PREFERRED EMBODIMENTS

Figure 1:
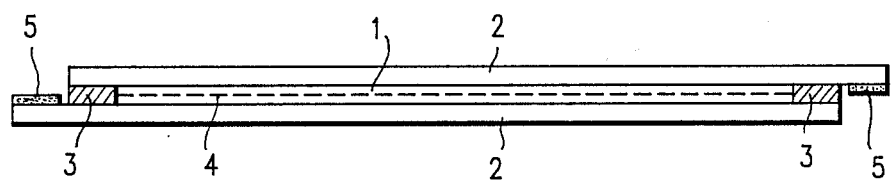
FIG. 1 illustrates a preferred embodiment of the recording cell containing the liquid crystal polymer.

The apparatus according to the invention contains a storage medium of polymeric liquid crystals with mesogenic side groups and is set up to store information by means of selective variation of the special order and/or orientation of the polymeric liquid crystals, whereby the macroscopically oriented film containing the polymeric liquid crystals is in the prepared condition for storing the information, i.e., while information is being stored, the film is in the shape-retaining region below the glass temperature $T_g$ of the polymeric liquid crystal and the selective variation of the special arrangement and/or orientation of the polymeric liquid crystals is preferrably undertaken locally by means of laser irradiation or exposure, whereupon the local arrangement containing the information remains frozen in the temperature range below $T_g$ of the polymeric liquid crystal after the laser beam is turned off.

Accordingly, the present invention begins with a storage medium which always retains its shape and contains the polymeric liquid crystals.

The requirements for the structure of the liquid crystal polymers for the various orientation methods are documented in the literature. Accordingly, for example, in an electrical field a homotropic orientation requires a positive dielectric anisotropy for the frequency range employed. A homogeneous orientation, in contrast, can often be produced by boundary surfaces made from a structured polyimide. Mesogenic groups with anisotropic shape are necessary for this purpose. See R. Kelker, R., Hatz Handbook of Liquid Crystals Verlag Chemie (1981), Pranoto, W. Haase, Mol. Cryst. Liq. Cryst., 98, 299–308 (1983); R. Zentel, R Ringsdorf Makromol. Chem., 182, 1245–1256 (1982); and Liquid Crystals and Ordered Fluids, A. Griffin, J. F. Johnsen, Vol. 4, Plenum Press, New York (1984).

The polymeric liquid crystals used according to the invention, consist entirely or partially of repetitive units, which can be represented schematically by the general formula (I), $$-[A-B]- \atop \phantom{-[A-}X-Y$$ (I)

whereby A—B designates the elements of the primary chain of the polymer, X designates a spacer unit, and Y designates a mesogenic side group.

In this formula the mesogenic side groups are responsible for the resulting liquid crystal character. Of particular interest are side chains of the smectogenic type.

The elements A—B preferably correspond to ethylenically unsaturated radically polymerizable units A'=B' which correspond to monomers having the structure A'=B'—X—Y. It is preferred that the units A'=B' are vinyl groups such as those in the radically polymerizable vinyl compounds, for example units of

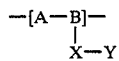

where $R_1$ stands for hydrogen or methyl and Q stands for a function which activates the double bond, such as the group

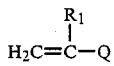

where $R_2$ refers to hydrogen or alkyl with from 1 to 6 carbon atoms.

The spacer group X represents a flexible chain with from 1 to 14 chain members, and preferably an alkylene group, —$(CH_2)_n$—, where n stands for a number from 1 to 14, inclusive. In some cases individual chain members can be substituted, for example, with a halogen such as chlorine or replaced with an ether bridge.

The mesogenic side chain Y may contain a functional group which connects the spacer group X with the actual mesogenic group M. Thus functional groups may be, for example, a —O—;

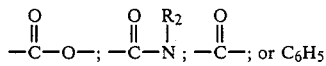

where $R_2$ has the same meaning as described above.

A listing of suitable mesogenic groups is found in Kelker and Hatz, Handbook of Liquid Crystals, Verlag Chemie, pp. 67–113 (1980).

Preferably, a mesogenic group M containing, for example, an aromatic radical, is bonded by the above-described connecting function. This mesogenic group M is preferably represented by the formula (II)

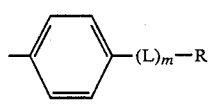 (II)

where L is a bridge consisting of the radicals

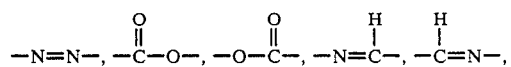

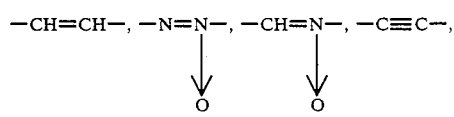

m is zero or one, and R is a radical

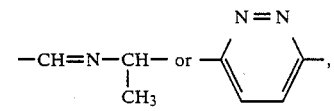

or if m is zero, R also stands for a radical

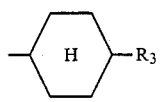

and L' and m' have the same meaning as L or m and where $R_3$ is hydrogen, $(O)_r$—$(CH_2)_p H$, —$COO(CH_2)_{p'} H$, —CN or halogen (particularly fluorine, chlorine or bromine) and p and p' are a number from 1 to 8, particularly 1 to 6, and r is zero or 1.

Preferred polymers of formula (I) include examples where M stands for the following mesogenic groups:

 (IA)

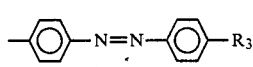 (IB)

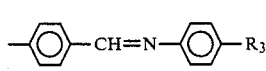 (IC)

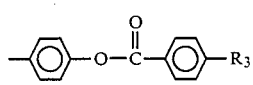 (ID)

-continued

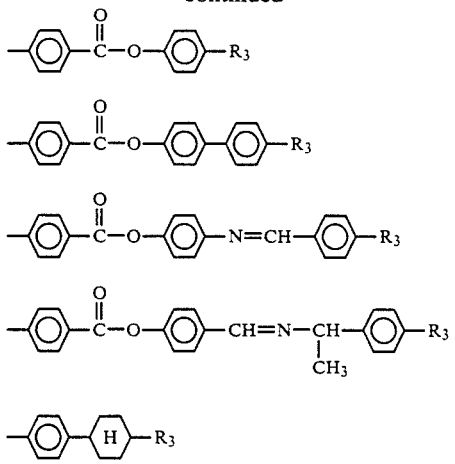

Also preferred are derivates of (meth)acrylic acid (A'=B' thereby stands for

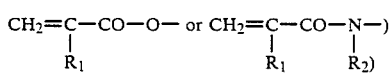

and derivatives in which the spacer X represents a —$(CH_2)_n$— group with n=1–14, inclusive.

The polymeric liquid crystals used according to the invention can also be the products of polycondensation. Particularly, polyesters of formula shown below

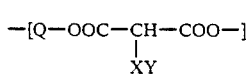

where Q is a linear alkyl radical (derived from the diol HO—Q—OH) or a para-alkylated aryl or especially, phenyl radicals. See B. Reck, H. Ringsdorf, Makromol. Chem. Rapid Commun., 6, 291-299 (1985). Of interest is a polymer having a radical

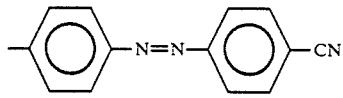

as the mesogenic group M and a —$(CH_2)_6$— radical as the spacer X. The groups —$(CH_2)_9$— or

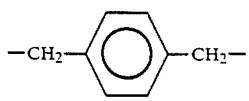

are named as examples of the radical Q.

Generally, the molecular weight of the polymeric liquid crystals lies in the range $\overline{M}=10^3$ to $10^5$, and generally in the range of 5,000–200,000 and preferably about 100,000 (determined by gel-permeation chromatography).

The viscosities in the isotropic phase generally lie in the range of $10^4$ poise.

The glass temperature ($T_g$) of the liquid crystal polymers used according to the invention generally lie in the range from $-40°$ to $110°$ C., and particularly in the range from $-10°$ to $80°$ C. For reference to glass temperature $T_g$, see I. Brandrup and E. H. Immergut, Polymer Handbook 2nd Ed. III - 139, J. Wiley, 1975).

The Apparatus

The absorption behavior of the liquid crystal polymer suggested for the information storage process will be adapted to the wavelength of the laser writer. This is accomplished, for example, by admixing a suitable dye or through inclusion of a dye in the polymerization of the polymer chain. The dye molecule itself can have a mesogenic character. It is preferred that a polymeric liquid crystal be employed, the mesogenic groups of which absorb in the required wavelength range. This corresponds to the extreme case of a mesogenic dye polymerized to 100%. The necessary extinction of the storage medium is adjusted by means of the dye concentration.

Suitable dyes are known from the literature. Dyes that are suitable for mixing into the liquid crystal phase are those that fulfill a series of conditions. See for example, J. Constant et al., J. Phys. D: Appl. Phys., Vol. 11, S. 479 et seq. (1978); F. Jones, et al. Mol. Cryst. Liq. Crystal, Vol. 60, p. 99 et seq. (1980); EP 43 904, EP 55 838 and EP 65 869.

The dyes should not ionize under the influence of an electrical field, should have as high a molecular extinction coefficient as possible, and simultaneously have good solubility in the employed liquid crystal matrix (i.e., the storage medium) and must be chemically/-photochemically stable. Dyes with appropriate characteristics are found, for example, in the class of the anthraquinones (See EP 56 492, EP 44 893, EP 59 036 and EP 54 217).

Suitable azo dyes are listed, for example, in DE 34 06 209. The proportion of dye to storage medium preferably lies in the range of 1 to 50% by weight.

Polymers with mesogenic groups and dye radicals in the side chains are the object of EP 7 574, EP 90 282 and EP 1 40 133. See also H. Ringsdorf, H. W. Schmidt, Makromol. Chem. Rapid Commun., ibid. Analogously to the above-described polymeric liquid crystals of formula (I), repeating units

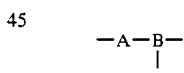

can form the primary chain elements of the monomer units containing the dye. The corresponding monomers A'=B'—X—Y' consequently contain the dye radical in the group Y'.

An example of a mesogenic group M, which simultaneously represents a dye radical, is the group

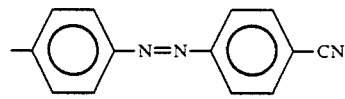

At the same time, a spacer group —$(CH_2)_6$— is preferred.

In principle, the polymer can be used in the form of a thin layer (film) or a laminate, as a coating for a solid or flexible matrix layer. The thickness of the film containing or consisting of the polymeric liquid crystals preferably lies in the range from $10^{-3}$ to $10^{-6}$ m. In a preferred embodiment, (See FIG. 1) the apparatus according to the invention includes a recording cell (1), consisting of two transparent plates (2) arranged in parallel planes, preferably glass plates suitably spaced from one another, generally by less than 1 mm, and preferably by about 10 µm. The base surface is several cm² to several dm². Conductive $InO_2/SnO_2$ is vapor deposited on the two inner surfaces of the glass plates (2) and conductive contacts are established to the outside. The glass plates prepared in this manner were fixed to one another with the aid of a heat-stable glue, such as a silicone glue, in such a manner that a cell-like empty inner chamber is formed with only one entrance and one exit of several mm width.

The desired spacing of the two glass plates (2) is rigidly set by two suitable spacers (3) of appropriate dimensions and preferably made of polyimide plastic. The recording cell also includes electrodes (5). After the glue dries, the cell is filled on a heatable device with the liquid crystal polymer (4), preferably of formula (I), which is in the isotropic condition. The yet empty cell chamber then is completely filled with the molten polymer by means of capillary action.

The advantage of this procedure as opposed to the use of a partially open cell is that the influence of air bubbles is reliably eliminated. In addition, in this manner standardized cell blanks can be produced within certain limits of variable geometry (outside dimensions, spacing) and at little expense. In a second step, these blanks (see FIG. 1) can then be filled as needed with corresponding liquid crystal polymers in the described manner.

The orientation takes place in a known manner through placement of an alignment field, particularly a magnetic field and specifically, an electrical field or by means of surface effects. In the case of the preferred use of an electrical field, at temperatures above $T_g$ a sine-wave alternating current (standard value V=500 V;ν=1 Khz) is applied to the thus-filled recording cell (1) and this voltage is maintained until cooled to room temperature. The result is an absolutely transparent liquid crystal film, which from a purely visual standpoint cannot be distinguished from the material in the isotropic condition. The glass temperature $T_g$ of the liquid crystal polymer lies above room temperature $T_a$. A temperature of 20° C. is assumed as room temperature. The reading of the information can be accomplished by illuminating the polymer film with monochromatic coherent light. Various orientation possibilities of the liquid crystalline polymeric film are possible to store information in the apparatus according to the invention:

1) The mesogenic groups are uniformly aligned parallel to the surface normal of the polymeric film layer. This can be done by application of (i) an electrical alternating field to the plates (2) coated with transparent electrodes, whereby the electrical field lies parallel to the normal direction of the polymeric film layer, (ii) by application of a magnetic field of (iii) by surface treatment.

2) The mesogenic groups are oriented parallel to the film plane and parallel to a macroscopically predetermined direction. This can take place either by coating the plates (2) with a suitable material such as polyimide and by structuring this coating along the desired preferred orientation or by suitable angled vapor-deposition of the substrate, such as with silicon oxide. The necessary orientation may also be produced by shearing or drawing.

In both cases 1) and 2) the orientation takes place in the liquid crystal condition.

The orientation is frozen in the glass condition by cooling. The recording cell (1) produced as described above forms the actual storage medium for storing the optical information.

Information Storage Process

The simplest manner of writing information consists in principle in the production of scatter centers by means of a focused laser beam, which converts the oriented, tempered liquid crystal polymer layer locally into the isotropic phase. The locally resulting macroscopic isotropic region is then frozen below the glass temperature.

In this regard, the following procedure is preferred:
The liquid crystal polymer film formed according to the invention is locally heated from room temperature to the isotropic phase in the focal region of a projection system. A focused laser beam is generally used, such as light from an argon laser with a wave length of 514.5 nm.

Turning off the laser light and subsequent cooling lead to the disoriented (macroscopically isotropic) regions. The resultant scatter centers can be read as optical information.

The experimental construction can be accomplished in accordance with M. Eich, J. H. Wendorff, Die Makromolekulare Chemie, Vol. 186, No. 12, 2639 (1985).

Erasing the Stored Information

Basically, the stored information can be erased by increasing the temperature above $T_g$ and cooling in an electrical or magnetic field. In this regard the following procedure is preferred:

Analogously to the preparation for the first writing process, the information stored in the liquid crystal polymer is erased by heating the recording cell (1) above $T_g$ preferably above $T_f$ and then cooling subject to applied alternating current (standard value 500 V, ν=1 Khz). After the writing and erasing processes have been repeated multiple times, it was determined that none of the steps performed resulted in irreversible changes in the recording cell.

The invention now being generally described, the same will be better understood by reference to certain specific examples which are included herein for purposes of illustration only and are not intended to be limiting of the invention or any embodiment thereof, unless specified.

Manufacture of the Liquid Crystal Polymer

The polymers employed according to the invention, particularly those with formula (I), can be produced in an essentially known manner. Reference is made to DE 27 22 589, DE 28 31 909, DE 30 20 645, DE 30 27 757, DE 32 11 400, and EU 90 282.

EXAMPLE 1

Direct connection of spacer and mesogenic group

As an example, the manufacture of compounds of type IA will be described. See V. P. Shibaev et al, Eur. Polym. J., 18, 651 (1982). Accordingly, a compound of formula (III)

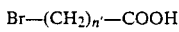 (III)

where n'=n−1 can be reacted with an inorganic acid chloride such as SOCl₂ and can be converted into the compound (IV), preferably in DMF.

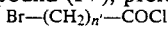 (IV)

This compound can be converted by a Friedel-Crafts reaction, for example, in nitrobenzene with biphenyl into the compound of formula (V)

Br—(CH₂)$_{n'}$—CO—C₆H₄—C₆H₅ (V)

which is reduced, for example, with lithium aluminum hydride to the compound (VI)

Br—(CH₂)$_n$—C₆H₄—C₆H₅ (VI)

This compound can react with Cl₂CHOC₄H₉ and titanium tetrachloride to form the compound (VII)

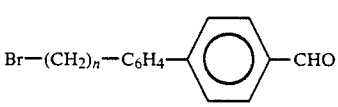 (VII)

Compound (VII) can react with hydroxylamine salt, preferably in the presence of a base such as pyridine, to form an oxime, and this, be means of dehydration, for example with the aid of an anhydride such as acetic anhydride, can be converted into the nitrile (VIII)

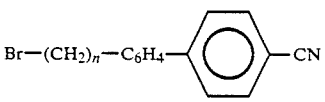 (VIII)

By reacting a salt of (meth)acrylic acid, for example in DMF, with compound (VIII), one obtains the compound of type IAa

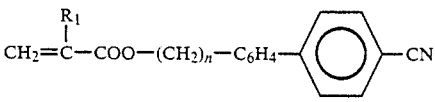 (IAa)

where R₁ stands for hydrogen or methyl.

Directly analogously, the compound IAb

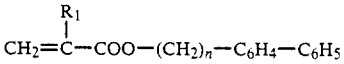 (IAb)

can be produced, for example from the compound (VI) and a salt of (meth)acrylic acid.

EXAMPLE 2

Connecting spacer and mesogenic group via an ether bridge

As an example, reference is made to the manufacture of a compound of type IA. See V. P. Shibaev loc. cit., N. A. Plate, V. P. Shibaev, J. Polym. Sci. Polym. Sympos. (IUPAC 1978), 67, 1 (1980).

Compound (IV) is reduced to the compound (IX), for example with lithium aluminum hydride in ether Br—(CH₂)$_n$—OH (IX)

which reacts with the compound (XI)

KO—C₆H₄—C₆H₄—CN (XI)

for example in methanol, to form the compound (XII).

HO—(CH₂)$_n$—O—C₆H₄—C₆H₄—CN (XII).

The hydroxy compound (XII) is converted into the compound IAc with the chloride of (meth)acrylic acid in the presence of an acid acceptor such as a tertiary amine.

$$\overset{R_1}{\underset{|}{CH_2=C}}-COO-(CH_2)_n-O-C_6H_4-C_6H_4-CN \quad (IAc)$$

A large variability with regard to the structures IA and IE-IJ is possible with the following synthesis method. See M. Portugall, H. Ringdorf, R. Zentel, Makromol. Chem., 183, 2311 (1982); H. Ringsdorf, A. Schneller, Brit. Polym. J., 13, 43 (1981).

Thus, from the compound (XIII)

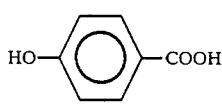 (XIII)

through a reaction with compound (XIV) in the presence of base

HO—(CH₂)$_n$—Cl (XIV)

the acid (XV)

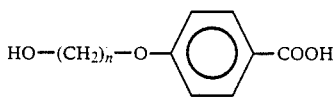 (XV)

is produced. Under acid catalysis, for example with p-toluene sulphonic acid in chloroform, the (meth)acrylic acid, is converted into the (meth)acrylic acid ester (XVI).

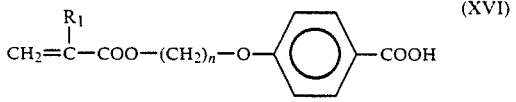 (XVI)

The compound (XVI) can be converted, for example analogously to (III), into the acid chloride, which with phenol or with phenols substituted in the para position can be converted into the compound IE

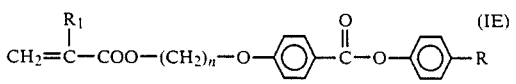 (IE)

or into the compounds IE, IF, IG, IH, and IJ.

EXAMPLE 3

Connecting spacer and mesogenic group by means of an ester group

As an example, reference is made to the manufacture of a compound of the type IA (See Plate et al loc. cit.; Shibaev et al loc. cit.), but the method is generally applicable for the mesogenic radicals IA–IJ. Thus, a starting compound (IV) reacts with a para-phenol corresponding to one of the mesogenic groups to form, for example, compound (XVII)

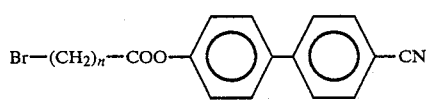
(XVII)

preferably in the presence of an acid acceptor and in an inert solvent such as THF. Compound (XVII) is further reacted with a salt of (meth)acrylic acid.

As an example for compounds having a chiral center (*), reference is made to the following synthesis. A biphenol of the formula (XVIII)

(XVIII)

reacts with a bromide of formula (XIX) in the presence of an alkali alcoholate

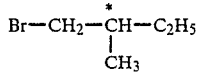
(XIX)

to form the phenol (XX).

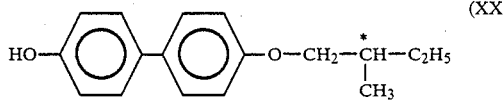
(XX)

By reaction with compound (XIV) in ethanol and the addition of base, one obtains the alcohol (XXI)

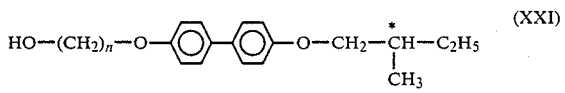
(XXI)

which is then esterified with (meth)acrylic acid.

Analogously to the synthesis of (XIV-XV), the reaction of compound (XIV) with a phenol of formula (XXII) in the presence of a base such as potash in acetone

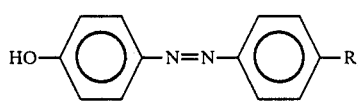
(XXII)

produces an alcohol of formula XXIII

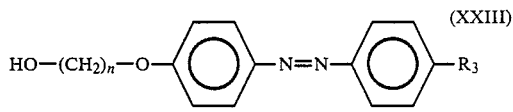
(XXIII)

which can be converted into compound of type IB through reaction with (meth)acrylic acid chloride.

Acid amides of formula (I) can be obtained, for example, by a reaction of (meth)acrylic acid chloride with an amine of formula (XXIV)

(XXIV)

to form (meth)acrylic acid amide (XXV)

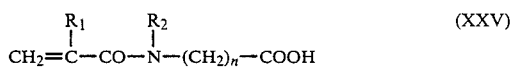
(XXV)

This compound can be converted into a compound of the type ID, for example, by reaction with

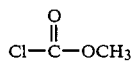

in the presence of an inert base with a phenol containing a mesogenic group such as, for example, (XXVI)

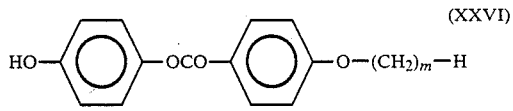
(XXVI)

Polymerization of the Monomers

In the polymerization of the monomers, such as those from type I, one can proceed according to the polymerization methods of the prior art. See Houben-Weyl, 4th Ed., Vol. 14/1, Georg Thieme Verlag (1961); H. Rauch-Puntigam, Th. Voelker "Acryl- and Methacrylverbindungen, Springer-Verlag, Berlin (1967); Kirk-Othmer, 3rd Ed. Vol. 18, J. Wiley (1982); and Schildknecht, Skeist, Polymerization Processes, Vol. 29 of "High Polymers" p. 133, Wiley-Interscience (1977).

Radical polymerization is an option for the polymerization of the compounds of formula (I). One may use for example solution polymerization, suspension/emulsion polymerization or bead polymerization. The usual radical initiators, such as azo or peroxy compounds may be used (See Rauch-Puntigam, Voelker, loc. cit, or Brandrup-Immergut, Polymer Handbook, loc. cit.) in quantities such as for example, 0.1 to 1% by weight relative to the monomers. Preferred initiators include azoisobutyronitrile, dibenzoylperoxide, and dilauroylperoxide. In some cases the polymerization can be controlled by the use of regulators, such as, for example, the common sulphur regulators, generally in quantities of from 0.05 to about 2% by weight relative to the monomers (See also DE 10 83 548).

The common temperature procedures and work up methods are also applicable.

The method will now be described in greater detail by a non-limiting example utilizing the (meth)acrylic compounds of formula (I) where A'=B'—X—Y corresponds to

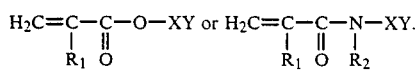

Polymerization Method in Solution

Approximately 0.35 mole of the (meth)acrylic monomer of formula (I) is dissolved in 850 ml or toluene. 1,8 mMol of azoisobutyronitrile is added thereto and the mixture is heated about 8 hours under an inert gas at about 333° K.

The resulting polymer is obtained by precipitation with a precipitation agent such as 1200 ml of methanol, and then separated and purified by being dissolved in a suitable solvent such as dichloromethane, and renewed precipitation with methanol.

Finally, the thus-obtained material, generally of a powdered consistency, is dried in a water jet vacuum at about 303° K. until it reaches weight constancy.

The glass temperature and the clarifying temperature are determined by thermal analysis.

Obviously, numerous modifications and variations of the present invention are possible in light of the above teachings. It is therefore to be understood that within the scope of the appended claims, the invention may be practiced otherwise than as specifically described herein.

What is claimed to be new and desired to be secured by Letters Patent of the United States is:

1. An apparatus for reversible optical data storage, comprising:
   (i) a substrate; and
   (ii) a macroscopically oriented film of a liquid crystal polymer in contact with said substrate,
   wherein said polymer is in the solid, shape retaining condition at a first temperature below the glass temperature of said polymer,
   wherein said polymer is in the isotropic liquid condition at a second temperature above the glass temperature of said polymer, and
   wherein said glass temperature is greater than room temperature,
   whereby data is stored by modulated local heating of said polymer at said first temperature to said second temperature wherein said polymer is in the isotropic liquid condition and whereby the data is fixed in the glass condition of said polymer when the heating is stopped.

2. The apparatus of claim 1, wherein said liquid crystal polymer comprises repeating units of the formula

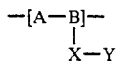

whereby A—B is the elements of the primary chain of said polymer, X is a spacer unit, and Y is a mesogenic side group.

3. The apparatus of claim 2, wherein said mesogenic side groups are of the smectogenic type.

4. The apparatus of claim 2, wherein said repeating units are radically polymerizable vinyl compounds with the formula

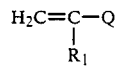

wherein $R_1$ is hydrogen or methyl and Q is a functional group which activates a double bond selected from the group consisting of C(O)—O—, C(O)—N($R_2$), C(O) or $C_6H_5$, wherein said $R_2$ is a hydrogen or alkyl group with from one to six carbon atoms.

5. The apparatus of claim 2, wherein X is a flexible chain with from 1 to 14 chain members.

6. The apparatus of claim 5, wherein said flexible chain is an unsubstituted or a halogen substituted $C_1$–$C_{14}$ alkylene group.

7. The apparatus of claim 5, wherein said flexible chain contains at least one ether linkage.

8. The apparatus of claim 2, wherein said mesogenic side group Y comprises a connecting functional group and the actual mesogenic group, wherein said connecting functional group is selected from the group consisting of —O—, —C(O)—O—, —C(O)—N($R_2$)—, —O—C(O)— or —N($R_2$)—C(O)—, and wherein $R_2$ is a hydrogen or alkyl group with from 1 to 6 carbon atoms.

9. The apparatus of claim 8, wherein said actual mesogenic group has the formula

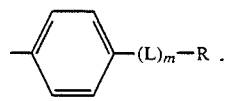

where L is a bridge consisting of the radicals

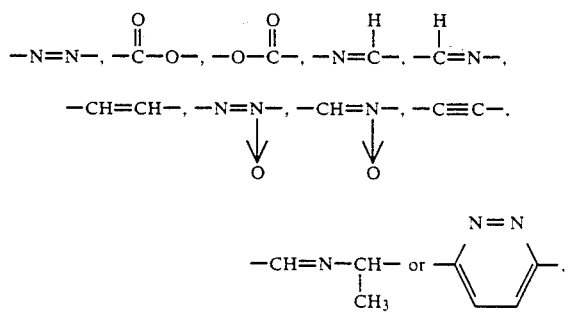

m is zero or one, and R is a radical

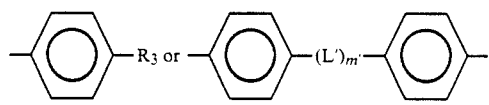

if m is zero, R also stands for a radical

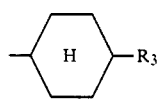

and L' and m' have the same meaning as L or m and wherein $R_3$ stands for hydrogen, (O)$_r$—(CH$_2$)$_p$H, COO(CH$_2$)$_p$H, —CN or halogen and p and p' are a number from 1 to 8 inclusive, particularly 1 to 6 and r is zero or 1.

10. The apparatus of claim 9, wherein said actual mesogenic group is

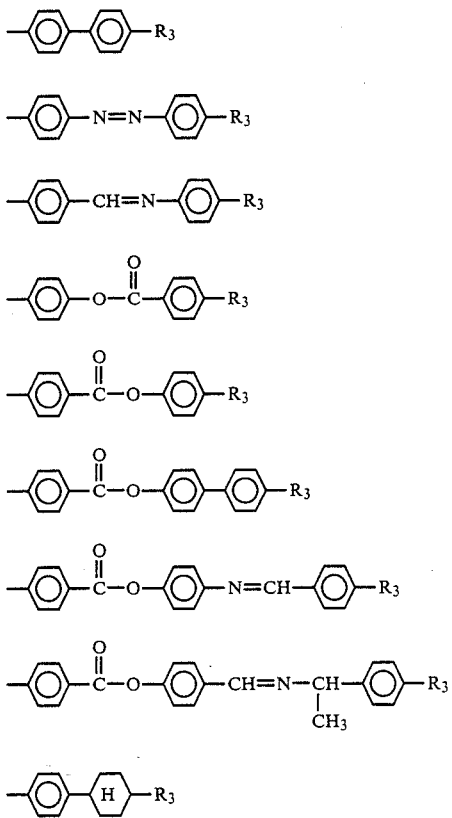

11. The apparatus of claim 1, wherein said polymeric liquid crystal comprises acrylate or (meth)acrylate monomers.

12. The apparatus of claim 1, wherein said liquid crystal polymer comprises repeating units of the formula

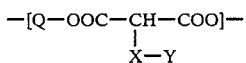

wherein Q is a linear alkyl radical or a para-alkylated aryl radical, X is a spacer unit and Y is a mesogenic side group.

13. The apparatus of claim 1, wherein said macroscopically oriented film is located between two plates or films located one above the other.

14. The apparatus of claim 1, wherein said liquid crystal polymer has a molar weight in the range between $10^3$ and $10^5$.

15. The apparatus of claim 1, further comprising a dye.

16. The apparatus of claim 1, wherein said dye comprises a dye-containing comonomer unit in said liquid crystal polymer.

17. A method for the reversible optical storage of data by an apparatus comprising:

(i) a substrate, and
(ii) a macroscopically oriented film of a liquid crystal polymer in contact with said substrate,
wherein said polymer is in the solid, shape retaining condition at a first temperature below the glass temperature of said polymer, wherein said polymer is in the isotropic liquid condition at a second temperature above the glass temperature of said polymer, and wherein the glass temperature is greater than room temperature, comprising the steps of:
(a) holding said film at said first temperature;
(b) storing data on said apparatus by locally reorienting said film by heating to the isotropic liquid condition; and
(c) reading the stored data by irradiating said film with a coherent, monochromatic light source.

18. The method of claim 17, wherein said reorienting is performed by a laser.

19. The method of claim 18, wherein the storing of data is performed with a laser having a wavelength which can be absorbed by said polymer and wherein said reading of data is performed with another laser having a different wavelength.

20. The process of claim 17, wherein the absorption characteristics of said polymer are adjusted by addition of a dye.

21. The method of claim 20, wherein the absorption maximum for said writing wavelength is adjusted by addition of a dye, and wherein the reading wavelength lies outside of said absorption maximum.

22. The process of claim 17, wherein said data is analog data.

23. The process of claim 17, wherein said data is digital data.

24. The method of claim 17, wherein said storing and reading steps are performed by moving said film and said light source relative to each other.

25. The method of claim 17, wherein a phase structure is produced in said polymer in a digital manner by means of said modulated light source.

26. The method of claim 17, wherein said light source is modulated by a computer.

27. The method of claim 17, wherein said storing step produces a data density of less than or equal to 2,000 lines per millimeter.

28. The method of claim 17, further comprising: erasing the stored data by selective local heating and cooling in an electrical or magnetic field.

29. The method of claim 17, further comprising: erasing the entire quantity of said stored data by heating and cooling said film in an electrical or magnetic field.

30. The method of claim 17, wherein said data comprises optical signal processing data, Fourier transformation and folding data or coherent optical correlation data.

31. The method of claim 17, wherein said storing step is performed by holographically irradiating said film with a coherent, monochromatic modulated light source, whereby reorientation of said polymer occurs and is frozen at said first temperature after the irradiation is stopped.

32. The method of claim 17, wherein said reorienting is performed by an electrical field.

* * * * *